(12) United States Patent
Lee et al.

(10) Patent No.: US 7,110,168 B2
(45) Date of Patent: Sep. 19, 2006

(54) OPTICAL SIGNAL TRANSMISSION APPARATUS INCLUDING REFLECTIVE GAIN-CLAMPED SEMICONDUCTOR OPTICAL AMPLIFIER

(75) Inventors: Jeong-Seok Lee, Anyang-si (KR); Ho-In Kim, Yongin-si (KR); In-Kuk Yun, Suwon-si (KR); Seung-Woo Kim, Seoul (KR); Hyun-Cheol Shin, Suwon-si (KR); Yun-Je Oh, Yongin-si (KR); Seong-Taek Hwang, Pyeongtaek-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 73 days.

(21) Appl. No.: 10/847,109

(22) Filed: May 17, 2004

(65) Prior Publication Data
US 2005/0088724 A1 Apr. 28, 2005

(30) Foreign Application Priority Data
Oct. 27, 2003 (KR) ....................... 10-2003-0075193

(51) Int. Cl.
*H04B 10/12* (2006.01)
(52) U.S. Cl. ................................. 359/341.32
(58) Field of Classification Search .......... 359/341.32, 359/333
See application file for complete search history.

(56) References Cited

U.S. PATENT DOCUMENTS

| | | | |
|---|---|---|---|
| 5,295,016 A * | 3/1994 | Van Deventer | 359/347 |
| 6,195,200 B1 * | 2/2001 | DeMarco et al. | 359/337.21 |
| 6,304,368 B1 * | 10/2001 | Hansen et al. | 359/334 |
| 6,310,716 B1 * | 10/2001 | Evans et al. | 359/334 |
| 6,353,499 B1 * | 3/2002 | Zanoni et al. | 359/341.32 |
| 6,628,454 B1 * | 9/2003 | Ghislotti et al. | 359/340 |
| 6,788,712 B1 * | 9/2004 | Atieh | 372/6 |
| 6,900,933 B1 * | 5/2005 | Li et al. | 359/341.32 |
| 2002/0008901 A1 * | 1/2002 | Kinoshita | 359/341.1 |

OTHER PUBLICATIONS

A. W. Naji, M. S. Z. Abidin, A. M. Kassir, M. H. Al-Mansoori, M. K. Abdullah, and M. A. Mahdi. Trade-Off Between Single and Double Pass Amplification Schemes of 1480-nm Pumped EDFA. Microwave and Opt. Tech. Lett./vol. 43, No. 1, Oct. 5, 2004. pp. 38-40.*

* cited by examiner

*Primary Examiner*—Jack Keith
*Assistant Examiner*—Ari Diacou
(74) *Attorney, Agent, or Firm*—Cha & Reiter, L.L.C.

(57) ABSTRACT

Disclosed are optical signal transmission apparatus including a reflective gain-clamped semiconductor optical amplifier and optical communication system using the optical signal transmission apparatus, which can improve modulation speed and optical power by effectively suppressing intensity noise of an incoherent light source. The optical signal transmission apparatus comprises a light source; a reflective gain-clamped semiconductor optical amplifier to generate gain-clamped optical signals having a substantially constant output intensity in a gain saturation region; a wavelength division multiplexing apparatus configured to spectrum-slice light from the light source, provide the spectrum-sliced light to the reflective gain-clamped semiconductor optical amplifier, and multiplex optical signals gain-clamped by the reflective gain-clamped optical amplifier, and a circulator for inputting the light generated by the light source to the wavelength division multiplexing apparatus, and outputting the optical signal multiplexed by the wavelength division multiplexing apparatus to a transmission link.

5 Claims, 5 Drawing Sheets

OPTICAL SIGNAL TRANSMISSION APPARATUS INCLUDING REFLECTIVE GAIN-CLAMPED SEMICONDUCTOR OPTICAL AMPLIFIER

CLAIM OF PRIORITY

This application claims priority to an application entitled "Optical signal transmission apparatus including reflective gain-clamped semiconductor optical amplifier and optical communication system using the same," filed in the Korean Intellectual Property Office on Oct. 27, 2003 and assigned Serial No. 2003-75193, the contents of which are hereby incorporated by reference.

BACKGROUND OF THE INVENTION

1. Field of the Invention

The present invention relates to wavelength division multiplexing optical communication, and more particularly to an optical signal transmission apparatus including a reflective gain-clamped semiconductor optical amplifier and an optical communication system using the optical signal transmission apparatus.

2. Description of the Related Art

Generally, a wavelength division multiplexing passive optical network (hereinafter, referred to as a WDM PON) provides an ultra high-speed broadband communication service using specific wavelengths assigned to each subscriber terminal. Therefore, the WDM-PON can (1) ensure the secrecy of communication, (2) easily accommodate special communication services required from each subscriber terminal or enlargement of channel capacity, and (3) easily increase the number of subscribers by adding specific wavelengths to be assigned to new subscribers. However, in spite of these advantages, the WDM-PON has not yet been put to practical use. This is because the WDM-PON requires both a light source having a specific oscillation wavelength and an additional wavelength stabilization circuit to stabilize the wavelength of the light source in the central office (CO) and each of the subscriber terminals. This, in turn, places a heavy economic burden on subscribers. Therefore, there is a need for an economical wavelength-division-multiplexed light source for use with the WDM-PON.

A number of devices have been proposed as the wavelength division multiplexing light sources. Such devices include, distributed feedback laser arrays (hereinafter, referred to as DFB laser arrays), multi-frequency lasers (hereinafter, referred to as MFLs), spectrum-sliced light sources, and mode-locked fabry-perot lasers with incoherent light, etc.

However, the DFB laser array and the MFL have complicated manufacturing processes. In addition, they are high-priced devices in which correct wavelength selectivity and wavelength stabilization are necessary for the wavelength-division-multiplexed method.

Spectrum-sliced light sources have been studied recently. These devices spectrum-slice an optical signal of wide bandwidth using an optical filter or a waveguide grating router (WGR) to provide a large number of wavelength-divided channels. Thus, the spectrum-sliced light source does not require a light source having a specific oscillation wavelength nor a device to stabilize wavelength. A number of devices have been proposed as the spectrum-sliced light sources. These devices include, light emitting diodes (hereinafter, referred to as LEDs), super luminescent diodes (hereinafter, referred to as SLDs), fabry-perot lasers (hereinafter, referred to as FP lasers), fiber amplifier light sources, and ultra-short pulse light sources, etc.

The LED and SLD, which have been proposed as the spectrum-sliced light sources, have very wide optical bandwidths and low prices. However, they have narrow modulation bandwidths and low output power. Thus, they have characteristics better suited for a light source for upward signals which have lower modulation speed as compared to downward signals. The FP laser is a high-power device with a low-price. However, it has a narrow bandwidth, thus cannot provide a number of wavelength-divided channels. Also, with the FP laser, serious degradation is caused by mode partition noise, when modulating a spectrum-sliced signal at high speed and transmitting the modulated signal. Further, the ultra-short pulse light source has a spectrum bandwidth of the light source that is very wide and has coherence. However, it has disadvantages including stabilization of the spectrum to be oscillated, which is low and has a pulse width only a few ps. Thus, realization of such an ultra-short pulse light source is difficult.

In addition to these light sources, spectrum-sliced fiber amplifier light sources have been proposed. A spectrum-sliced fiber amplifier light source, spectrum-slices an amplified spontaneous emission light (ASE light) generated from an optical fiber amplifier and then provides a number of wavelength-divided high-power channels. However, such light sources must use a high-priced external modulator such as an $LiNbO_3$ modulator, so that each channel transmits different data from each other.

A mode-locked FP laser with incoherent light spectrum-slices a wide bandwidth optical signal. The optical signal is generated from an incoherent light source, such as a light emitting diode or a fiber amplifier light source. The mode-locked FP laser uses an optical filter or a waveguide grating router to slice the optical signal. It then inputs the spectrum-sliced light signals into an FP laser having no isolator. Subsequently, a mode-locked signal outputted from the FP laser is used for transmission. When a spectrum-sliced signal, above a predetermined output power, is inputted into an FP laser, the FP laser generates and outputs only the same wavelength as that of the spectrum-sliced signal input to the FP laser. The mode-locked FP laser with incoherent light transmits data economically, since it directly modulates an FP laser according to a data signal.

However, when the spectrum-sliced incoherent light does not coincide with an Fabry-Perot mode, the mode-lock phenomenon of the FP laser is released. Accordingly, when the FP laser is used as an optical transmitter, a central wavelength of an incoherent light source must always coincide with the Fabry-Perot mode, or predetermined wavelength intervals must be maintained. This is required in order to maintain stable transmission characteristics even with respect to variation of environment such as temperature.

A reflective semiconductor optical amplifier (hereinafter, referred to as a R-SOA) has been proposed. When the R-SOA is used, since the gain property of the R-SOA does not rapidly change according to wavelength, it is unnecessary to coincide a spectrum-sliced light source with a mode. Also, intensity noise of incoherent light source is suppressed using the gain saturation property of the amplifier according to the input intensity of the purposely spectrum-sliced light source. Thus, an increased modulation speed can be obtained.

However, in the R-SOA, gain saturation according to gain intensity occurs smoothly, and thus suppressing intensity noise by gain saturation is limited.

SUMMARY OF THE INVENTION

Accordingly, the present invention has been made to reduce or overcome the above-mentioned problems occurring in the prior art. One object of the present invention is to provide an optical signal transmission apparatus including a reflective gain-clamped semiconductor optical amplifier and an optical communication system using the optical signal transmission apparatus, which can improve modulation speed and optical power by effectively suppressing intensity noise of an incoherent light source.

In accordance with the principles of the present invention, an optical signal transmission apparatus is provided, comprising: a light source; a reflective gain-clamped optical amplifier to generate gain-clamped optical signals having a substantially constant output intensity in a gain saturation region; a wavelength division multiplexing apparatus configured to spectrum-slice light from the light source, provide the spectrum-sliced light to the reflective gain-clamped optical amplifier, and multiplex optical signals gain-clamped by the reflective gain-clamped optical amplifier.

According to a further aspect of the invention a circulator is provided for inputting the light generated by the light source to the wavelength division multiplexing apparatus, and outputting the optical signal multiplexed by the wavelength division multiplexing apparatus to a transmission link.

In order to accomplish the aforementioned objects, according to one aspect of the present, there is provided a bi-directional wavelength division multiplexing optical communication system comprising: a central office including downstream reflective gain-clamped optical amplifiers to generate a plurality of downstream channels having different wavelengths, which have a constant output intensity in a gain saturation region, the central office configured to multiplex and transmit the downstream channels, and demultiplex a received upstream optical signal; a remote node configured to demultiplex a downstream optical signal from the central office, and multiplex and transmit a plurality of received upstream channels to the central office; and a plurality of optical network units including upstream reflective gain-clamped optical amplifiers for generating a plurality of upstream channels having different wavelengths, which have a constant output intensity in a gain saturation region, each optical network unit configured to transmit the upstream channel to the remote node and detect the downstream channel from the remote node.

BRIEF DESCRIPTION OF THE DRAWINGS

The present invention will be more apparent from the following detailed description taken in conjunction with the accompanying drawings, in which.

DETAILED DESCRIPTION OF THE PREFERRED EMBODIMENT

Hereinafter, the present invention will be described with reference to the accompanying drawings. For the purposes of clarity and simplicity, a detailed description of known functions and configuration incorporated herein will be omitted as it may make the subject matter of the present invention unclear.

Figure 1:
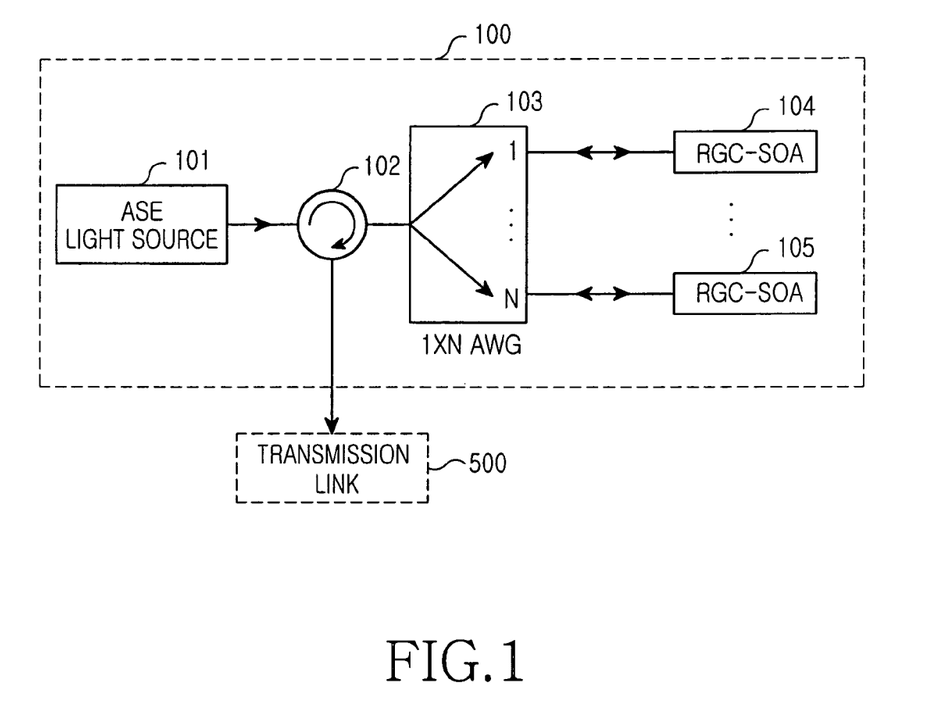
FIG. 1 is a block diagram of an optical signal transmission apparatus using a gain-clamped semiconductor optical amplifier according to a preferred embodiment of the present invention.

FIG. 1 is a block diagram of an optical signal transmission apparatus using a gain-clamped semiconductor optical amplifier according to a preferred embodiment of the present invention. The optical signal transmission apparatus 100 of the present invention outputs wavelength division multiplexed optical signals to an optical transmission link 500. The apparatus 100 includes an amplified spontaneous emission source (hereinafter, referred to as an ASE source) 101, an optical circulator 102, a 1×N arrayed waveguide grating (AWG) 103, and a number N of reflective gain-clamped semiconductor optical amplifiers 104 to 105.

The ASE source 101 has a wide wavelength band, which generates and outputs amplified spontaneous emission light. This light is injected to the reflective gain-clamped semiconductor optical amplifiers 104 to 105.

The optical circulator 102 includes first through third ports. It transmits the light emitted from the ASE source 101 to the AWG 103 and outputs an optical signal multiplexed by the AWG 103 to the optical transmission link 500.

The AWG 103 is disposed between the optical circulator 102 and the reflective gain-clamped semiconductor optical amplifiers 104 to 105. It includes one multiplexing port and N number of demultiplexing ports. The AWG 103 spectrum-slices the amplified spontaneous emission light, which is inputted to the multiplexing port through the optical circulator 102. It then outputs the spectrum-sliced light to the reflective gain-clamped semiconductor optical amplifiers 104 to 105. Further, the AWG 103 multiplexes gain-clamped optical signals, from the reflective gain-clamped semiconductor optical amplifiers 104 to 105, and outputs the multiplexed signals.

The N number of reflective gain-clamped semiconductor optical amplifiers 104 to 105 are respectively connected to the N number of demultiplexing ports of the AWG 103. Further, the gain-clamped optical signals output from the reflective gain-clamped semiconductor optical amplifiers 104 to 105, have constant output intensity in a gain saturation region.

Hereinafter, the mode-lock of general fabry-perot laser (hereinafter, referred to as an FP-LD), semiconductor optical amplifier and the intensity noise of an incoherent light source will be described before explaining the operation of the reflective gain-clamped semiconductor optical amplifier 104 according to the present invention.

Figure 2:
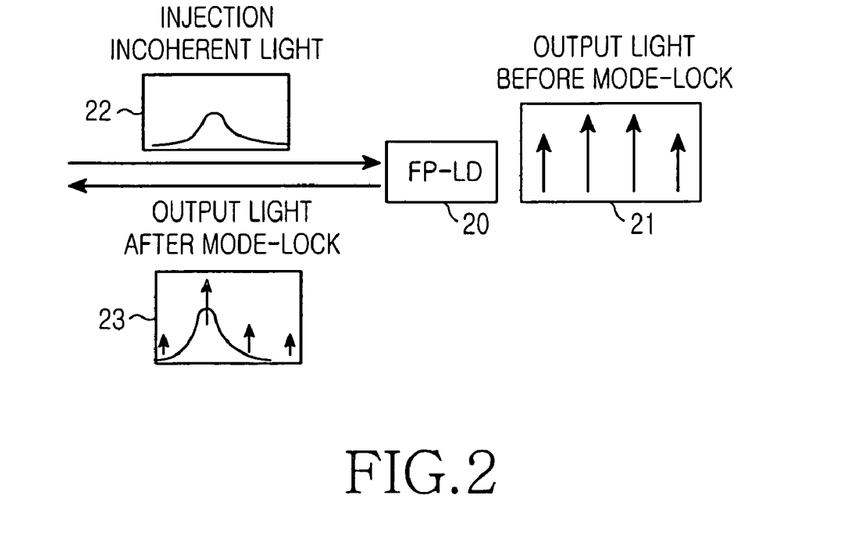
FIG. 2 illustrates a mode-lock of a conventional fabry-perot laser.

FIG. 2 illustrates the mode-lock of the FP-LD. In FIG. 2, reference numeral 21 represents a spectrum of output light before the mode-lock of the FP-LD 20. Reference numeral 22 represents a spectrum of exterior incoherent light inputted to the FP-LD 20. Reference numeral 23 represents a spectrum of output light of the mode-locked FP-LD 20 with the inputted exterior incoherent light.

In FIG. 2, a plurality of oscillation modes 21 appear around one wavelength with predetermined wavelength intervals apart from each other in the FP-LD 20. The oscillation modes 21 correspond to a resonance wavelength of a laser diode and gain property of a composition material, in contrast with a distributed feedback laser outputting single wavelength. If coherent light or incoherent light 22 is input to the FP-LD 20, oscillation modes which do not coincide with the wavelength of the injected light are suppressed. In contrast, only oscillation modes coinciding with the wavelength of the injected light are amplified and outputted (see 23 in FIG. 2).

In general, a broadband light source has intensity noise. This intensity noise means that the intensity of the light source spectrum-sliced by a wavelength division demultiplexer varies according to time. However, when light emitted from the light source generates an optical signal while passing through an FP-LD, the intensity noise of the light source broadens the 1st level of the signal. This causes limitations in the modulation and transmission speeds.

Figure 3:
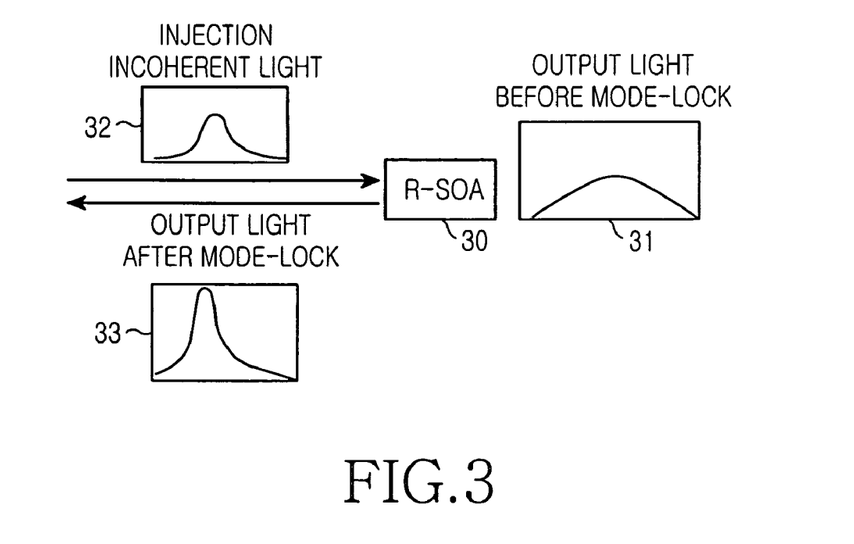
FIG. 3 illustrates a mode-lock of a semiconductor optical amplifier.

FIG. 3 illustrates the mode-lock of the reflective semiconductor optical amplifier. In FIG. 3, reference numeral 31 represents a spectrum of output light before the mode-lock of the reflective semiconductor optical amplifier (hereinafter, referred to as a R-SOA) 30. Reference numeral 32 represents a spectrum of exterior incoherent light inputted to the R-SOA 30. Reference numeral 33 represents a spectrum of output light of the mode-locked R-SOA 30 with the incoherent light inputted from an exterior.

In a general SOA, when the input light intensity is small, the SOA operates as a linear amplifier. Thus, the gain is according to the intensity of the inputted signal. In contrast, when the input light intensity is large, the SOA displays non-linearity having a gain saturation.

Figure 4:
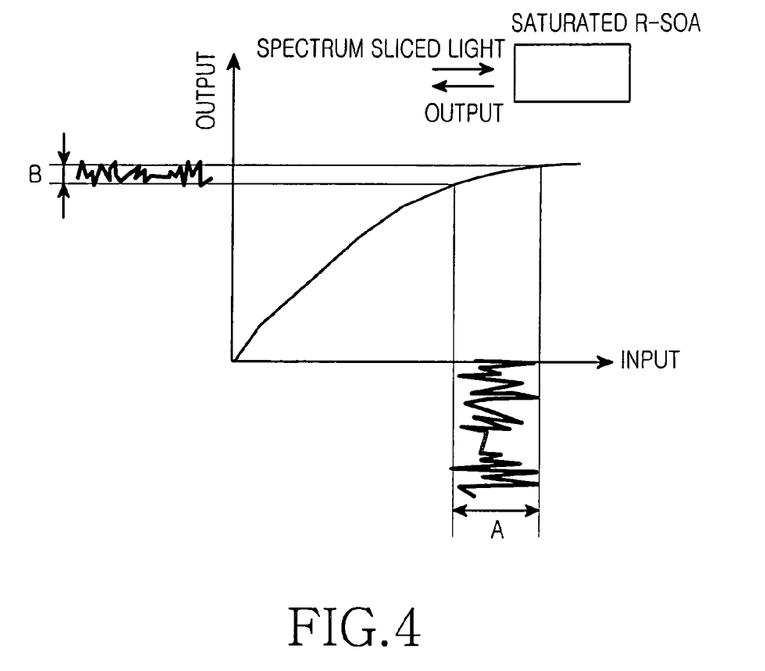
FIG. 4 is a graph illustrating the suppression effect of intensity noise due to a gain saturation of a reflective semiconductor optical amplifier.

As shown in FIG. 4, the gain property of the R-SOA is proportional to the intensity of input light at low input optical intensity. The linear property in which the gain increases is shown in FIG. 4. When the input light intensity exceeds a predetermined value, the gain value gradually decreases. Using this property, if the average intensity of a light source having intensity noise is located in a gain saturation region, as shown in FIG. 4, and light emitted from an input light source (which oscillates with a maximum amplitude A in variation according to time) is injected to the SOA, the amplitude variation of the light according to time is reduced to a magnitude B due to the gain saturation property.

Figure 5:
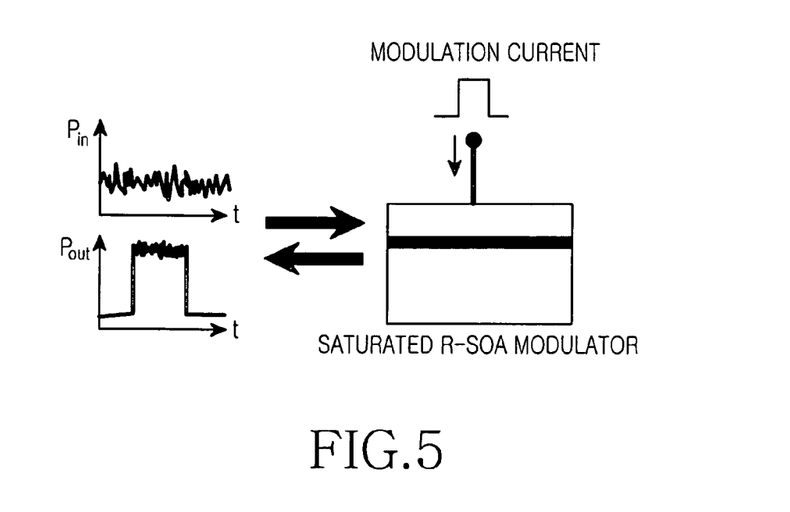
FIG. 5 illustrates properties of input and output optical signals of an optical amplifier using a reflective semiconductor optical amplifier.

As shown in FIG. 5, reduction of the amplitude variation of the light source due to the SOA under a gain saturation driving condition means that the intensity noise of a modulated signal is suppressed.

However, in the R-SOA, the gain saturation occurs smoothly according to increasing intensity of the inputted light. Therefore, there is a limitation in the suppression on the intensity noise by the gain saturation.

Figure 6:
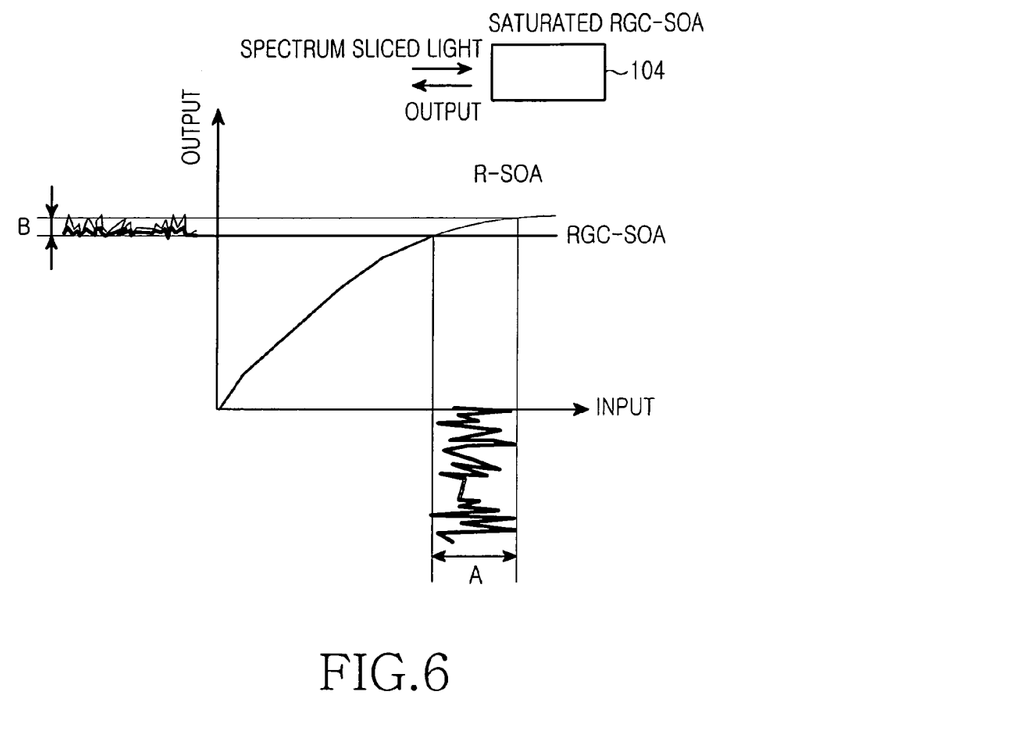
FIG. 6 is a graph illustrating the suppression effect of intensity noise due to a gain saturation of a reflective gain-clamped semiconductor optical amplifier according to the present invention.
Figure 7:
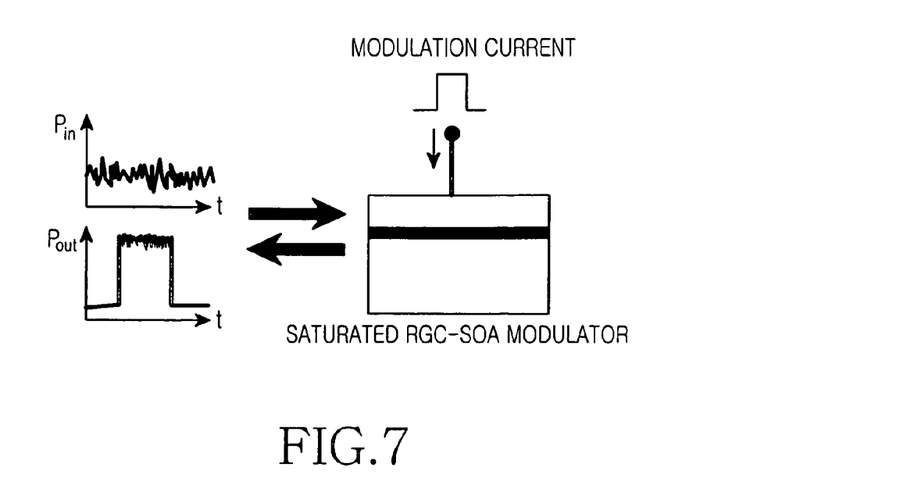
FIG. 7 illustrates properties of the input and output optical signals of an optical amplifier using a reflective gain-clamped semiconductor optical amplifier according to the present invention.

Hereinafter, the operation of the reflective gain-clamped semiconductor optical amplifier 104 shown in FIG. 4 will be described. FIG. 6 is a graph showing the suppression effect of intensity noise due to a gain saturation of the reflective gain-clamped semiconductor optical amplifier 104 according to the present invention. FIG. 7 shows the input and output optical signals when the reflective gain-clamped semiconductor optical amplifier is used as an optical transmitter.

As shown in FIG. 6, differently from a SOA, the reflective gain-clamped semiconductor optical amplifier has a gain property. Moreover, the gain property has linearity in which gain increases up to a predetermined intensity of input light is maintained, and the gain is rapidly reduced if a gain saturation starts to occur. That is, the reflective gain-clamped semiconductor optical amplifier has a property that, if the gain saturation occurs, the intensity of amplified output light varies little and is constantly outputted even though the intensity of input light varies.

As shown in FIG. 7, if the minimum intensity of the input light, which has a variation of intensity according to time, grows larger than a gain saturation region, the intensity of outputted light source varies little according to time. This property is very effective in suppression on intensity noise of an incoherent light source.

Referring again to FIG. 1, broadband light having a wide wavelength band emitted from the ASE source 101 is inputted to the AWG 103 through the first port and the second port of the optical circulator 102. The broadband light is spectrum-sliced by the AWG 103. The light is then inputted to the reflective gain-clamped semiconductor optical amplifiers 104 to 105 connected to the N number of demultiplexing ports of the AWG 103. The reflective gain-clamped semiconductor optical amplifiers 104 to 105 receive the spectrum-sliced incoherent light and output gain-clamped optical signals having a constant output intensity regardless of intensity of the inputted light in a gain saturation region. The gain-clamped optical signals are multiplexed by the AWG 103 and transmitted to the transmission link 500 through the circulator 102. The reflective gain-clamped semiconductor optical amplifier induces a single wavelength of oscillation at the center of the gain in order to clamp the gain. Further, the optical signal contains only a desired wavelength at the 1st level thereof, while the optical signal contains an oscillation wavelength at the 0 level thereof. The signal outputted from the amplifier has a total optical intensity which shows nearly no change regardless whether the signal is at the 1st level or 0 level. When the gain-clamped semiconductor optical amplifier is used as an optical transmitter, it seems that the gain-clamped semiconductor optical amplifier does not completely generate signals due to an oscillation wavelength. However, if light, which is emitted from the gain-clamped semiconductor optical amplifier, is injected to the AWG, only a wavelength corresponding to a desired signal passes. The oscillation wavelength does not pass, thus there is no problem in the properties of the signal even without a separate wavelength filter.

Meanwhile, the reflective gain-clamped semiconductor optical amplifier can be achieved by a high reflection coating of one end surface of a general gain-clamped semiconductor optical amplifier. At this time, the high reflection coating must have a characteristic of high reflection factor in a wavelength area required to be used in an optical transmission system.

Figure 8:
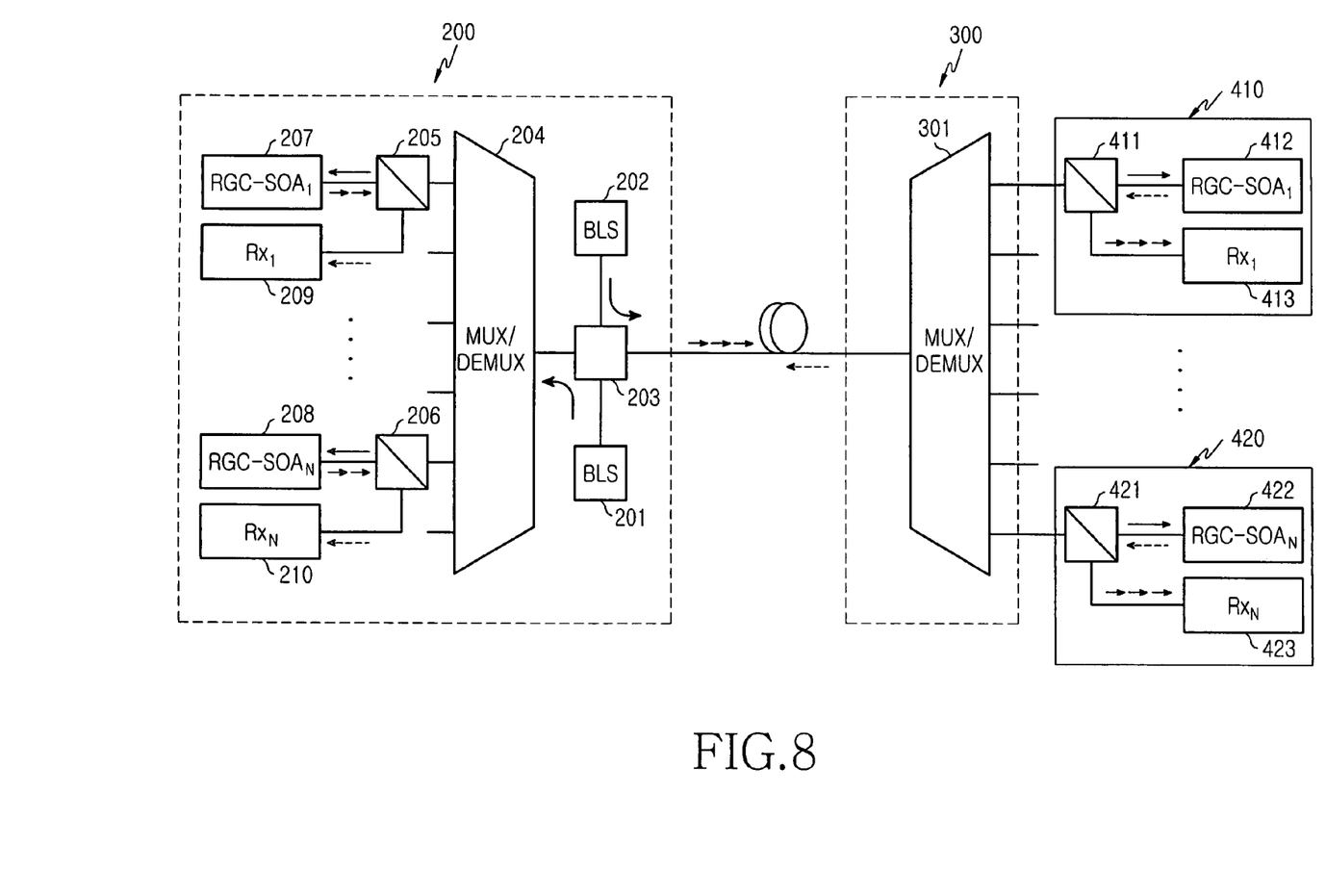
FIG. 8 is a block diagram of an optical communication system achieved by using an optical signal transmission apparatus including a gain-clamped semiconductor optical amplifier according to the present invention.

FIG. 8 is a block diagram of an optical communication system using an optical signal transmission apparatus including the gain-clamped semiconductor optical amplifier according to the present invention. Referring to FIG. 8, in a passive optical network according to the present invention, a central office 200, a remote node 300, and N number of optical network units (hereinafter, referred to as an ONUs) 410 to 420 are connected to each other by transmission optical fibers.

The central office 200 includes a downstream broadband light source 201, an upstream broadband light source 202, an optical splitter/combiner 203, a multiplexer/demultiplexer 204, N number of wavelength selection couplers 205 to 206, N number of downstream reflective gain-clamped semiconductor optical amplifiers 207 to 208, and N number of photodetectors 209 to 210.

The downstream broadband light source 201 and the upstream broadband light source 202 output downstream broadband light having a wide wavelength band. They can be achieved by an incoherent light source such as an erbium doped fiber amplifier, a semiconductor optical amplifier, a light emitting diode, or a super-luminescent diode.

The splitter/combiner 203 outputs an upstream optical signal. The signal is outputted from the remote node 300, to the multiplexer/demultiplexer 204. It also outputs a downstream optical signal, which is outputted from the multiplexer/demultiplexer 204, to the remote node 300. Further, the splitter/combiner 203 is connected to the downstream broadband light source 201 and the upstream broadband light source 202. Accordingly, the splitter/combiner 203 outputs the downstream broadband light to the multiplexer/demultiplexer 204, and outputs upstream broadband light to a multiplexer/demultiplexer 301 of the remote node 300.

The multiplexer/demultiplexer 204 demultiplexes the downstream broadband light and an upstream optical signal outputted from the splitter/combiner 203. It then outputs the demultiplexed light and signal to a corresponding wavelength selection couplers 205 or 206. Moreover, the multiplexer/demultiplexer 204 spectrum-slices the downstream broadband light into N number of incoherent lights having different wavelengths, and demultiplexes the upstream optical signal into a plurality of upstream channels having different wavelengths. Also, the multiplexer/demultiplexer 204 demultiplexes downstream channels.

The N number of wavelength selection couplers 205 to 206 output incoherent light having corresponding wavelengths to the downstream reflective gain-clamped semiconductor optical amplifiers 207 to 208, respectively. It also outputs the upstream channels to the photodetectors 209 to 210.

The N number of downstream reflective gain-clamped semiconductor optical amplifiers 207 to 208 receives spectrum-sliced incoherent lights so as to output gain-clamped optical signals, respectively. The minimum intensity of input light is set, so as to be larger than the gain saturation region.

The N number of photodetectors 209 to 210 detect the upstream channels, respectively.

The remote node 300 includes the multiplexer/demultiplexer 301. It spectrum-slices the upstream broadband light outputted from the upstream broadband light source 202 of the central office 200, and outputs the spectrum-sliced light to a corresponding ONU 410 or 420. Further, the remote node 300 multiplexes N number of upstream channels outputted from each of the N number of ONUs 410 and 420, and outputs the multiplexed channel to the central office 200. Furthermore, the multiplexer/demultiplexer 301 demultiplexes the downstream optical signal outputted from the central office 200 into N number of downstream channels having different wavelengths, and outputs the demultiplexed channels to a corresponding ONU 410 or 420.

Each of the N number of ONUs 410 and 420 includes a wavelength selection coupler 411 or 421, an upstream reflective gain-clamped semiconductor optical amplifiers 412 or 422, and a photodetector 413 or 423.

The N number of wavelength selection couplers 411 to 421 output incoherent light having corresponding wavelengths to the upstream reflective gain-clamped semiconductor optical amplifiers 412 to 422. They also output downstream channels to the photodetectors 413 to 423, respectively.

The N number of upstream reflective gain-clamped semiconductor optical amplifiers 412 to 422 receive spectrum-sliced incoherent lights so as to output gain-clamped optical signals The N number of photodetectors 413 to 423 detect the respective downstream channels.

Hereinafter, the operation of the wavelength division multiplexing passive optical network using the reflective gain-clamped semiconductor optical amplifier of the present invention will be described.

Referring to FIG. 8, when downstream transmission is performed, the downstream broadband light (having a wide wavelength band, which is outputted from the downstream broadband light source 201 located at the central office 200) is inputted to the multiplexer/demultiplexer 204 through the splitter/combiner 203. The broadband light is spectrum-sliced into the N number of incoherent lights having different wavelengths by the multiplexer/demultiplexer 204. The spectrum-sliced lights are inputted to the downstream reflective gain-clamped semiconductor optical amplifiers 207 to 208 through the wavelength selection couplers 205 to 206, respectively. The N number of gain-clamped semiconductor optical amplifiers 207 to 208 receive spectrum-sliced incoherent lights, and output downstream channels having clamped gain regardless of intensity of the inputted light, respectively. The downstream channels are inputted to the multiplexer/demultiplexer 204 through the wavelength selection couplers 205 to 206, respectively. The inputted channels are multiplexed by the multiplexer/demultiplexer 204 and transmitted to the remote node 300 through the splitter/combiner 203. The multiplexed downstream optical signal transmitted to the remote node 300 is demultiplexed by the multiplexer/demultiplexer 301 into the N number of channels having different wavelengths. The demultiplexed channels are inputted to the photodetectors 413 to 423 through the wavelength selection couplers 411 to 421, respectively. Then, the inputted channels are detected by the photodetectors 413 to 423 as electrical signals.

In contrast, when upstream transmission is performed, the upstream broadband light (having a wide wavelength band, which is outputted from the upstream broadband light source 202 located at the central office 200) is inputted to the multiplexer/demultiplexer 301 located at the remote node 300 through the splitter/combiner 203. The broadband light is spectrum-sliced into the N number of incoherent lights having different wavelengths by the multiplexer/demultiplexer 301. The spectrum-sliced lights are inputted to the upstream reflective gain-clamped semiconductor optical amplifiers 412 to 422 through the wavelength selection couplers 411 to 421, respectively. The N number of gain-clamped semiconductor optical amplifiers 412 to 422 receive spectrum-sliced incoherent lights, and output upstream channels having clamped gain, respectively. The upstream channels are inputted to the multiplexer/demultiplexer 301 through the wavelength selection couplers 411 to 421, respectively. The inputted channels are multiplexed by the multiplexer/demultiplexer 301 to be transmitted to the central office 200. The multiplexed upstream optical signal transmitted to the central office 200 is transmitted to the multiplexer/demultiplexer 204 through the splitter/combiner 203 so as to be demultiplexed by the multiplexer/demultiplexer 204 into the N number of channels having different wavelengths. The demultiplexed channels are inputted to the photodetectors 209 to 210 through the wavelength selection couplers 205 to 206, respectively. Then, the inputted channels are detected by the photodetectors 209 to 210 as electrical signals.

As described above, the present invention can effectively suppress intensity noise of a signal due to incoherent light by utilizing a gain saturation property of a reflective gain-clamped semiconductor optical amplifier. Accordingly, the present invention can obtain high modulation speed and optical power in wavelength division multiplexing transmission method using a spectrum-sliced light source.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. An optical signal transmission apparatus comprising:
   a light source;
   a reflective gain-clamped optical amplifier to generate gain-clamped optical signals having a substantially constant output intensity in a gain saturation region; and
   a wavelength division multiplexing apparatus configured to spectrum-slice light from the light source, provide the spectrum-sliced light to the reflective gain-clamped optical amplifier, and multiplex optical signals gain-clamped by the reflective gain-clamped optical amplifier.

2. The optical signal transmission apparatus as claimed in claim 1, further including a circulator for inputting the light generated by the light source to the wavelength division multiplexing apparatus, and outputting the optical signal multiplexed by the wavelength division multiplexing apparatus to a transmission link.

3. The optical signal transmission apparatus as claimed in claim 2, wherein the light source is an incoherent light source.

4. The optical signal transmission apparatus as claimed in claim 3, wherein the incoherent light source includes one of an erbium doped fiber amplifier, a semiconductor optical amplifier, a light emitting diode, or a super-luminescent diode.

5. The optical signal transmission apparatus as claimed in claim 1, wherein the wavelength division multiplexing apparatus includes a 1×N arrayed waveguide grating.

* * * * *